(12) United States Patent
Saint-Luc et al.

(10) Patent No.: US 6,900,687 B2
(45) Date of Patent: May 31, 2005

(54) CIRCUITRY AND METHOD TO PROVIDE A HIGH SPEED COMPARATOR FOR AN INPUT STAGE OF A LOW-VOLTAGE DIFFERENTIAL SIGNAL RECEIVER CIRCUIT

(75) Inventors: Olivier A. Saint-Luc, Santa Cruz, CA (US); Jackie Chu, Fremont, CA (US)

(73) Assignee: Virtual Silicon Technology, Inc., Sunnyvale, CA (US)

( * ) Notice: Subject to any disclaimer, the term of this patent is extended or adjusted under 35 U.S.C. 154(b) by 14 days.

(21) Appl. No.: 10/609,006

(22) Filed: Jun. 26, 2003

(65) Prior Publication Data

US 2005/0007161 A1 Jan. 13, 2005

Related U.S. Application Data

(60) Provisional application No. 60/393,088, filed on Jun. 27, 2002.

(51) Int. Cl.[7] .............................................. H03K 17/60
(52) U.S. Cl. ...................................... 327/478; 327/53
(58) Field of Search ............................. 327/53, 65–66, 327/69–70, 108, 333, 478, 482, 485–492

(56) References Cited

U.S. PATENT DOCUMENTS

| 5,392,003 | A | * | 2/1995 | Nag et al. ................... 330/254 |
| 5,801,564 | A | | 9/1998 | Gasparik .................... 327/170 |
| 5,959,490 | A | | 9/1999 | Candage et al. ............ 327/333 |
| 6,066,972 | A | | 5/2000 | Strom ........................ 327/175 |
| 6,130,548 | A | | 10/2000 | Koifman ...................... 326/21 |
| 6,172,535 | B1 | | 1/2001 | Hopkins ...................... 327/66 |
| 6,208,208 | B1 | * | 3/2001 | Komatsu et al. ............ 330/255 |
| 6,280,011 | B1 | | 8/2001 | Schloeman et al. .......... 347/12 |
| 6,320,406 | B1 | | 11/2001 | Morgan et al. ............. 326/14 |
| 6,433,528 | B1 | * | 8/2002 | Bonelli et al. ............. 323/315 |
| 6,590,452 | B1 | * | 7/2003 | van Rhijn ................... 330/253 |
| 6,621,308 | B2 | * | 9/2003 | Tinsley et al. ............. 327/108 |

\* cited by examiner

*Primary Examiner*—My-Trang Nu Ton
(74) *Attorney, Agent, or Firm*—Sierra Patent Group, Ltd.

(57) ABSTRACT

An input stage circuit for an LVDS circuit. The input stage has a folded cascode that receives input signals. The folded cascode has a first input circuit and a second input circuit. The first input circuit receives a first input signal from a connected circuit and the second input circuit receives a second signal from the connected circuit. A first current mirror receives signals from the first input circuit of said folded cascode. A second current mirror receives signals from the second input circuit. The first current mirror and the second current mirror are connected to a common output to merge signals from the first and second input circuits. A diode adjusts a voltage level of the signals to an output voltage.

17 Claims, 2 Drawing Sheets

Figure 1:
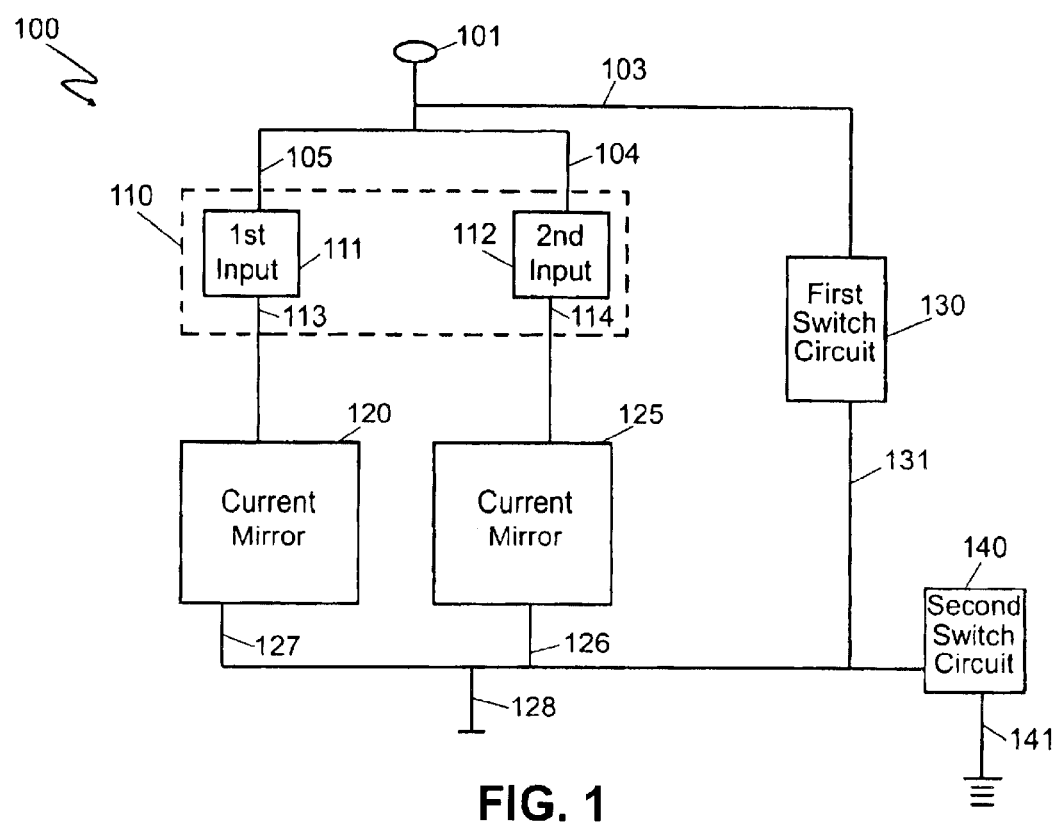

CIRCUITRY AND METHOD TO PROVIDE A HIGH SPEED COMPARATOR FOR AN INPUT STAGE OF A LOW-VOLTAGE DIFFERENTIAL SIGNAL RECEIVER CIRCUIT

CROSS RELATED APPLICATIONS

This application claims priority to provisional application 60/393,088 filed on Jun. 27, 2002 and which is hereby explicitly incorporated by reference as if set forth below.

BACKGROUND OF THE INVENTION

1. Field of the Invention

The present invention relates to an input stage for a Low-Voltage Differential Signal (LYDS) receiver circuit. More particularly, this invention relates to a comparator in the receiver circuit. Still more particularly, this invention relates to a high-speed comparator that does level shifting in the input stage.

2. The Prior Art

Most electronic devices used in today's society are made up of many different integrated circuits. The integrated circuits in these devices are becoming denser as the dimensions of semiconductors components of the integrated circuits decrease. The decreased dimensions of the semiconductor components allow for faster devices that do not require as much power or electrical current to operate. For example, many conventional semiconductor components used to require 3.3 volts of power to operate. However, other semiconductor components, such as transistors require approximately 1.2 volts to operate. The use of components having lower power requirements is important in mobile devices such as laptop computers and cellular telephones. The lower power allows a power supply in the device, such as a battery, to last longer and be simaller.

It is a problem that many devices still incorporate integrated circuits with high-powered components and integrated circuits with the lower-powered components. These devices may connect the lower power integrated circuits to high-powered integrated circuits. Thus, an integrated circuit operating on a lower voltage may receive an input at a higher voltage. This is a particular problem when an input of a higher voltage from a high voltage integrated circuit is applied to the lower voltage integrated circuit.

The particular problem is that the thin film oxide of the low voltage integrated circuit may suffer oxide breakdown from exposure to a voltage higher than the maximum supply voltage. This will cause catastrophic damage to the components of the low voltage integrated circuit.

One area where this is a particular problem is LVDS circuits that provide I/O communication to Integrated circuit. Typically, an LVDS receiver operates at 1.2 volts. However, circuitry connected to the LVDS receiver may operate at 3.3 volts.

Thus, there is a need in the art for an input stage of a low-powered LVDS receiver circuit that limits the voltage of signals applied to the circuit.

BRIEF DESCRIPTION OF THE INVENTION

The above and other problems in the art are solved by an input stage for an LVDS circuit designed in accordance with this invention. The input stage designed in accordance with this invention connects low voltage circuitry to high voltage circuitry and prevents high voltage signals from the high voltage circuitry to be applied to low voltage circuitry in order to prevent damage to the low voltage circuitry.

In accordance with this invention, the input stage is configured in the following manner. The input stage has a folded cascode that receives input signals. The folded cascode has a first input circuit, and a second input circuit. The first input circuit receives a first input signal from a connected circuit and the second input circuit receives a second signal from the connected circuit. A first current, mirror receives signals from the first input circuit of said folded cascode. A second current mirror receives signals from the second input circuit. The first current mirror and the second current mirror are connected to a common output to merge signals from the first and second input circuits. A diode adjusts a voltage level of the signals to an output voltage.

BRIEF DESCRIPTION OF THE DRAWING FIGURES

Figure 2:
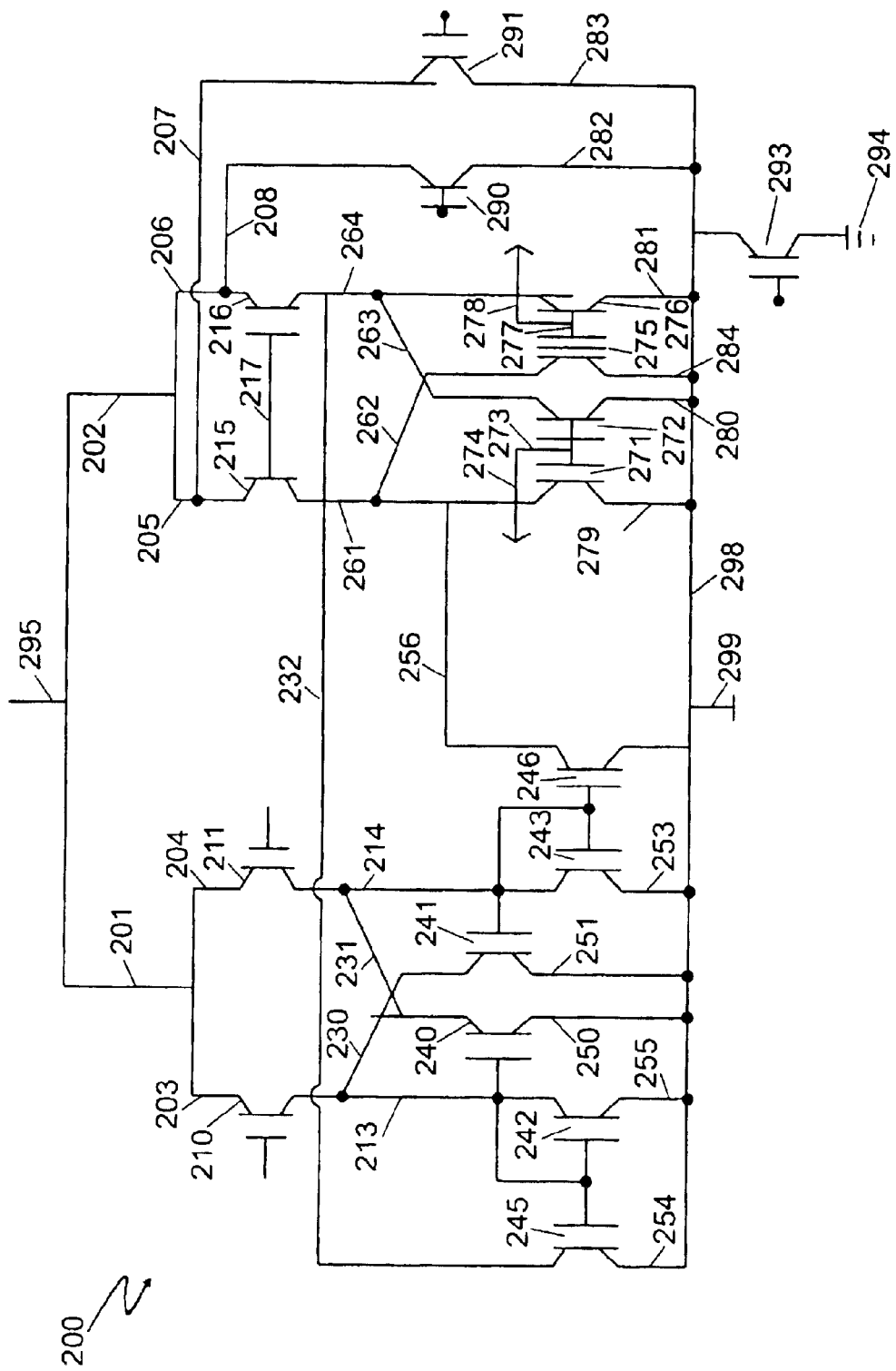

The above and other feature of a method and circuitry in accordance with this invention are described in the following detailed description and the following drawings:

FIG. 1 illustrating a block diagram of the components of a comparator in an input stage of an LVDS receiver circuit in accordance with this invention; and FIG. 2 illustrating a circuit diagram of a comparator of input stage in accordance with this invention.

DETAILED DESCRIPTION OF THE INVENTION

The following description of exemplary embodiments of this invention is not intended to limit the scope of the invention to these embodiments, but rather to enable any person skilled in the art to make and use the invention.

In accordance with this invention, an input stage of an LVDS receiver I/O circuit is provided. This input stage includes a comparator that provides a level shift of received signals from a higher voltage to a lower voltage. Preferably, the level shift is from a 3.3 volt in put to the operating power of 1.2 Volt operating range of an LVDS receiver circuit.

FIG. 1 illustrates a block diagram of an input stage 100 for an LVSD receiver circuit in accordance with this invention. Input stage 100 includes folded cascode circuitry 110. Folded cascode circuitry 100 receives signals in a very wide common mode. The range of the received signals in the common mode is preferable of about 0 volts to about 3 volts.

Folded cascode circuitry includes a first input 111 that receives a first signal from an input via path 105 and second input 112 that receives second signals from an input via path 104. The inputs 111 and 112 are configured in parallel to be sensitive to a wide common mode signal, which is preferably in a range from about 0 volts to about 3 volts. The signals received via path 105 and 104. This means that a voltage difference between, signals applied to paths 104 and 105 indicate the value of the signal. A precise configuration of first input 111 and second input 112 are provided in the following detailed exemplary embodiment of this invention.

First input 111 is connected to first current mirror 120 via path 113 and second input 112 is connected to second current mirror 125 via path 114. Current mirrors 120 and 125 provide an output current that is a scalar of the received signals by a constant. The outputs of current mirrors 120 and 125 are applied to out 128 via paths 127 and 126.

A first switch circuit 130 is connected to the input source via path 103 and output 128 via path 131. The first switch circuit 130 shifts the high voltage of the input to the desired low voltage of the output.

A second switch circuit 140 is connected between output 128 and ground. This prevents Vds and Vgs.

FIG. 2 illustrates a circuit diagram of a circuit 200 providing the components of circuit 100 in accordance with this invention. In FIG. 1, folded cascode circuitry 110 includes a first input 111 and second input 1112. In FIG. 2, first input 111 (FIG. 1) includes a first pair of transistors including transistor 210 and transistor 211. Preferably, transistors 210 and 211 are of a same type. For purposes of this discussion type of transistors means either n-channel MOS transistor or p-channel MOS transistor. Also preferably, transistors 210 and 211 are thin gate transistors. This allows for less capacitance for a given gain of the transistors. A source of first transistor 210 connects to the input via paths 201 and 203. The drain of first transistor 210 is connected to a current mirror via path 213. A source of second transistor 211 is connected to input 295 via paths 201 and 204. The drain of second transistor is connected to a current mirror via path 214.

In FIG. 2, first input 112 (FIG. 1) includes a second pair of transistors including transistor 215 and transistor 216. Preferably, transistors 215 and 216 are of a same type. Also preferably, transistors 215 and 216 are of an opposite type of transistors 210 and 211. Although one skilled in the art will recognize that other configurations may be used to allow the use of the same type of transistor. Also preferably, transistors 215 and 216 are thin gate transistors. This allows for less capacitance for a given gain of the transistors. A source of transistor 215 connects to the input 295 via paths 202 and 205. The drain of first transistor 215 is connected to a current mirror via path 261. A source of second transistor 216 is connected to input 295 via paths 202 and 206. The drain of second transistor 216 is connected to a current mirror via path 264. The gates of transistors 215 and 216 are connected to one another.

In FIG. 2, the first switch circuit 130 (FIG. 1) is provided by circuitry configured in the following manner. A source of a first transistor 290 is connected to path 206. The drain of first transistor 290 is connected to path 298 that connects to output 299. The gate of first transistor is connected to control circuitry (not shown). The source of second transistor 291 is connected to path 205, of the input via path 207. The drain of second transistor 291 is connected to path 298, which in turn connects to output 299, via path 283. The gate of second transistor is connected to control circuitry (not shown). Preferably, transistors 290 and 291 are thin gate transistors. This allows for less capacitance for a given gain of the transistors.

In FIG. 2, the first current mirror 120 (FIG. 1) is configured in the following manner. Path 213 from the drain of transistor 203 connects to a source of transistor 242. The gate of transistor 242 connects to path 213 and the gates of transistors 245 and 240. The drain of transistor 242 connects path 255. Path 255 connects to output 299 via path 298.

Path 214 connects to a source of transistor 243. The gate of transistor 243 connects to path 214 and the gates of transistors 246 and 241. The drain of transistor 243 is connected to path 298 via path 253. Path 298 connects to output 299.

Path 230 connects the drain of transistor 210 to a source of transistor 241. The gate of transistor 241 connects to path 214 and 246. The drain of transistor 241 connects to path 298 via path 251. Preferably, transistor 241 is a thin gate transistor. This allows for less capacitance for a given gain of the transistors.

Path 231 connects the drain of transistor 211 to a source of transistor 240. A gate of transistor 240 is connected to path 213 and the gates of transistors 242 and 245. The drain of transistor 240 connects to path 288 via path 250. Preferably, transistor 240 is a thin gate transistor. This allows for less capacitance for a given gain of the transistors.

Transistor 245 has a source that is connected to the drain of transistor 216 via path 232. The gate of transistor 245 is connected to path 213 and the gates of transistors 240 and 242. The drain of transistor 245 is connected to path 298 via path 254. Preferably, transistor 245 is a thin gate transistor. This allows for less capacitance for a given gain of the transistors.

Transistor 246 has a source that is connected to the drain of transistor 215 via paths 261 and 256. The gate of transistor 246 is connected to path 214 and the gates, of transistors 241 and 243. The drain of transistor 246 is connected to path 298 via path 257. Preferably, transistor 246 is a thin gate transistor. This allows for less capacitance for a given gain of the transistors.

In FIG. 2, second current mirror 125 is configured in the following manner. Path 261 from the drain of transistor 215 is connected to the source of transistor 271. The gate of transistor 271 is connected to the gate of transistor 272 via path 273 and to control circuitry via path 274. The drain of transmitter 271 is connected to path 288 via path 279. Preferably, transistor 271 is a thin gate transistor. This allows for less capacitance for a given gain of the transistor.

Path 264 connects a source of transistor 276 to the drain of transistor 216. The gate of transistor 276 is connected to the gate of transistor 275 via path 2777 and to control circuitry (not shown) via path 278. The drain of transistor 276 connects to path 288 via path 281. Preferably, transistor 276 is a thin gate transistor. This allows for less capacitance for a given gain of the transistors.

Path 262 connects a source of transistor 275 to the drain of transistor 215 via path 261. The gate of transistor 275 is connected to the gate of transistor 276 and control circuitry (not shown). The drain of transistor 275 is connected to path 288 via path 284. Preferably, transistor 275 is a thin gate transistor. This allows for less capacitance for a given gain of the transistors.

Path 263 connects a source of transistor 272 to the drain of transistor 216 via path 264. The gate of transistor 272 is connected, to the gate of transistor 271 via path 273 and to control circuitry (not shown via path 274. The drain of transistor 272 is connected to path 298 via path 280. Preferably, transistor 272 is a thin gate transistor. This allows for less capacitance for a given gain of the transistor.

In FIG. 2, the second switch circuit 140, which connects the output to ground is a transistor 293 having a source connected to path 288 and a drain connected to ground. The gate of transistor 293 is connected to control circuitry (not shown). Preferably, transistor 293 is a thin gate transistor. Transistor 293 prevents Vds and Vgs of the transistors in circuit 200.

The above include exemplary embodiments in accordance with the present invention. It is expected that those skilled in the art can an will design circuits that infringe this invention as set forth in claims below either literally or through the Doctrine of Equivalents.

What is claimed is:

1. An input stage circuit for an LVDS circuit comprising:
a folded cascode having a first input circuit and a second input circuit wherein said first input circuit receives a first input signal from a connected circuit and said second input circuit receives a second signal from said connected circuit;

a first current mirror that receives signals from said first input circuit of said folded cascode;

a second current mirror that receives signals from said second input circuit and wherein said first current mirror and said second current mirror are connected to a common output to merge signals from said first and second input circuits; and a first switch circuit connected between an input of said folded cascode and the common output for adjusting a voltage level of said signals to an output voltage.

2. The input stage of claim 1 wherein said first input circuit comprises:

a first transistor; and a second transistor connected in parallel to said first transistor.

3. The input stage of claim 2 wherein said first and said second transistors are N-channel MOS transistors.

4. The input stage of claim 2 wherein said first and second transistors are P-channel MOS transistors.

5. The input stage of claim 2 wherein said first and said second transistors are thin gate transistors.

6. The input stage of claim 1 wherein said second input circuit comprises:

a third transistor; and a fourth transistor connected in parallel to said third transistor.

7. The input stage of claim 6 wherein said third and said fourth transistors are N-channel MOS transistors.

8. The input stage of claim 6 wherein said third and said fourth transistors are P-channel MOS transistors.

9. The input stage of claim 6 wherein said third and said fourth transistors are thin gate transistors.

10. The input stage of claim 6 wherein said third and said fourth transistors are of a different type than a type of a first and a second transistors in said first input.

11. The input stage of claim 1 further comprising:

at least one transistor in said first current mirror, wherein said at least one transistor is a thin gate transistor; and at least one transistor in said second current mirror wherein said at least one transistor is a thin gate transistor.

12. The input stage of claim 1 wherein said first switch circuit comprises:

a first transistor having a source connected to a first source of said first input circuit and a drain connected to said output; and a second transistor having a source connected to a second source of said first input and a drain connected to said output.

13. The input stage of claim 12 wherein said first and said second transistors in said first switch circuit are thin gate transistors.

14. The input stage of claim 1 further comprising:

a second switch circuit connected between said output and ground.

15. The input stage of claim 14 wherein said second switch circuit connected between said output comprises:

a transistor having a source connected to said output and a drain connected to ground.

16. The input stage of claim 15 wherein said transistor of said second switch connected between said output and ground is a thin gate transistor.

17. An method for providing an input stage circuit for an LVDS circuit comprising:

applying signals to a folded cascode having a first input circuit and a second input circuit wherein said first input circuit receives a first input signal from a connected circuit and said second input circuit receives a second signal from said connected circuit;

applying output signals from said first output circuit to a first current mirror that receives signals from said first input circuit of said folded cascode;

applying output signals from said second input circuit to a second current mirror that receives signals from said second input circuit;

merging output signals from said first current mirror and said second current mirror; and adjusting a voltage level of said signals to an output voltage though a switch circuit connected between an input of said folded cascode and said output.

* * * * *